United States Patent [19]
Naber

[11] 3,833,919
[45] Sept. 3, 1974

[54] MULTILEVEL CONDUCTOR STRUCTURE AND METHOD

[75] Inventor: Charles T. Naber, Centerville, Ohio

[73] Assignee: The National Cash Register Company, Dayton, Ohio

[22] Filed: Oct. 12, 1972

[21] Appl. No.: 296,920

[52] U.S. Cl. .................................... 357/71, 357/73
[51] Int. Cl. .... H01l 23/48, H01l 29/46, H01l 29/54, H01l 29/62
[58] Field of Search .................................... 317/234

[56] References Cited

UNITED STATES PATENTS

| | | | |
|---|---|---|---|
| 3,497,407 | 2/1970 | Esch et al. | 156/17 |
| 3,546,013 | 12/1970 | Perri et al. | 117/215 |
| 3,566,457 | 3/1971 | Engeler | 29/571 |
| 3,575,743 | 4/1971 | Chiovarou et al. | 148/187 |
| 3,581,161 | 5/1971 | Cunningham | 317/234 |
| 3,584,264 | 6/1971 | McLouski et al. | 317/234 |
| 3,632,433 | 1/1972 | Tokuyama et al. | 117/212 |

*Primary Examiner*—Rudolph V. Rolinec
*Assistant Examiner*—E. Wojciechowicz
*Attorney, Agent, or Firm*—J. T. Cavender; Lawrence P. Benjamin

[57] ABSTRACT

The present invention relates to a multilevel conductor structure and to a method of insulating an upper level of conductors from a lower level of conductors on a silicon substrate of an integrated circuit. An undoped silicon oxide insulator layer and a doped silicon oxide insulator layer are successively placed on the lower level of conductors and the structure is heated to a temperature which is sufficient to cause the doped oxide insulator layer to soften and to flow above the lower conductors to produce tapered steps over the edges of the lower level of conductors. An upper level of conductor is then formed on the tapered doped silicon oxide insulator layer. The undoped silicon oxide insulator layer formed between the doped silicon oxide insulator layer and the lower level of conductors prevents doping atoms of the doped silicon oxide insulator layer from penetrating into source or drain regions of the silicon substrate which are usually in the vicinity of the lower level of conductors to change their conductivity.

7 Claims, 8 Drawing Figures

MULTILEVEL CONDUCTOR STRUCTURE AND METHOD

BACKGROUND OF THE INVENTION

In U.S. Pat. No. 3,646,665 issued to M. J. Kim on Mar. 7, 1972, a doped silicon oxide layer is used above a first level of conductors on a silicon substrate in order to dope the silicon substrate. A second level of conductors is then placed on the doped silicon oxide layer. The lower level of conductors may be made of molybdenum or polysilicon. An undoped oxide layer is not placed between the n-type silicon oxide insulator layer and the lower level of conductors to prevent doping atoms of the doped silicon oxide insulator layer from doping the silicon substrate. Further a doped silicon oxide insulator layer is not used by Kim to produce tapered steps above edges of the lower level of conductors, but is used to dope regions of semiconductor material to either side of the lower level of conductors.

In accordance with the present invention, an undoped silicon dioxide insulator layer is formed on a lower level of conductors before a doped silicon oxide insulator layer is formed on the conductors. The undoped insulator layer prevents the doped oxide layer from doping semiconductor material which is usually to either side of the conductors. The structure is heated to a temperature which is sufficient to cause the doped silicon oxide insulator layer to soften and to flow, to produce tapered steps above the edges of the lower level of conductors. An upper level of conductors is then placed on the tapered doped silicon oxide insulator layer. The undoped silicon oxide insulator layer below the doped silicon oxide insulator layer prevents doping atoms of the doped silicon oxide insulator layer from reaching the semiconductor material to either side of the lower level of p-type polysilicon conductors during the heating step which produces tapered steps in the doped silicon oxide insulator layer. Polysilicon, or refactory type metal such as molybdenum or tungsten may be used to form the lower conductors since these materials can withstand a high temperature boron diffusion step which is carried out prior to the deposition of an undoped oxide layer on the lower level of conductors, the boron diffusion producing source and drain regions to the sides of some of the lower level of conductors.

SUMMARY OF THE INVENTION

The present invention relates to a method of forming multilevel conductors comprising forming an undoped silicon oxide insulator layer on a lower level of conductors, forming a doped silicon oxide insulator layer on the undoped silicon oxide insulator layer, heating the structure to a temperature sufficient to cause the doped silicon oxide insulator layer to flow, thereby producing a gradual taper in the surface of the doped silicon oxide insulator layer above the edges of the lower level of conductors, and then forming an upper level of conductors on the tapered doped silicon oxide insulator layer.

An object of the present invention is to provide a structure wherein an upper level of conductors is insulated from a level of conductors by an insulator layer which has tapered steps therein.

Another object of the present invention is to provide a method of insulating an upper level of conductors from a lower level of conductors while eliminating breakage of the upper level of conductors at points where they pass over edges of the lower level of conductors.

DESCRIPTION OF THE PREFERRED EMBODIMENT

Figures 1, 2, 3:
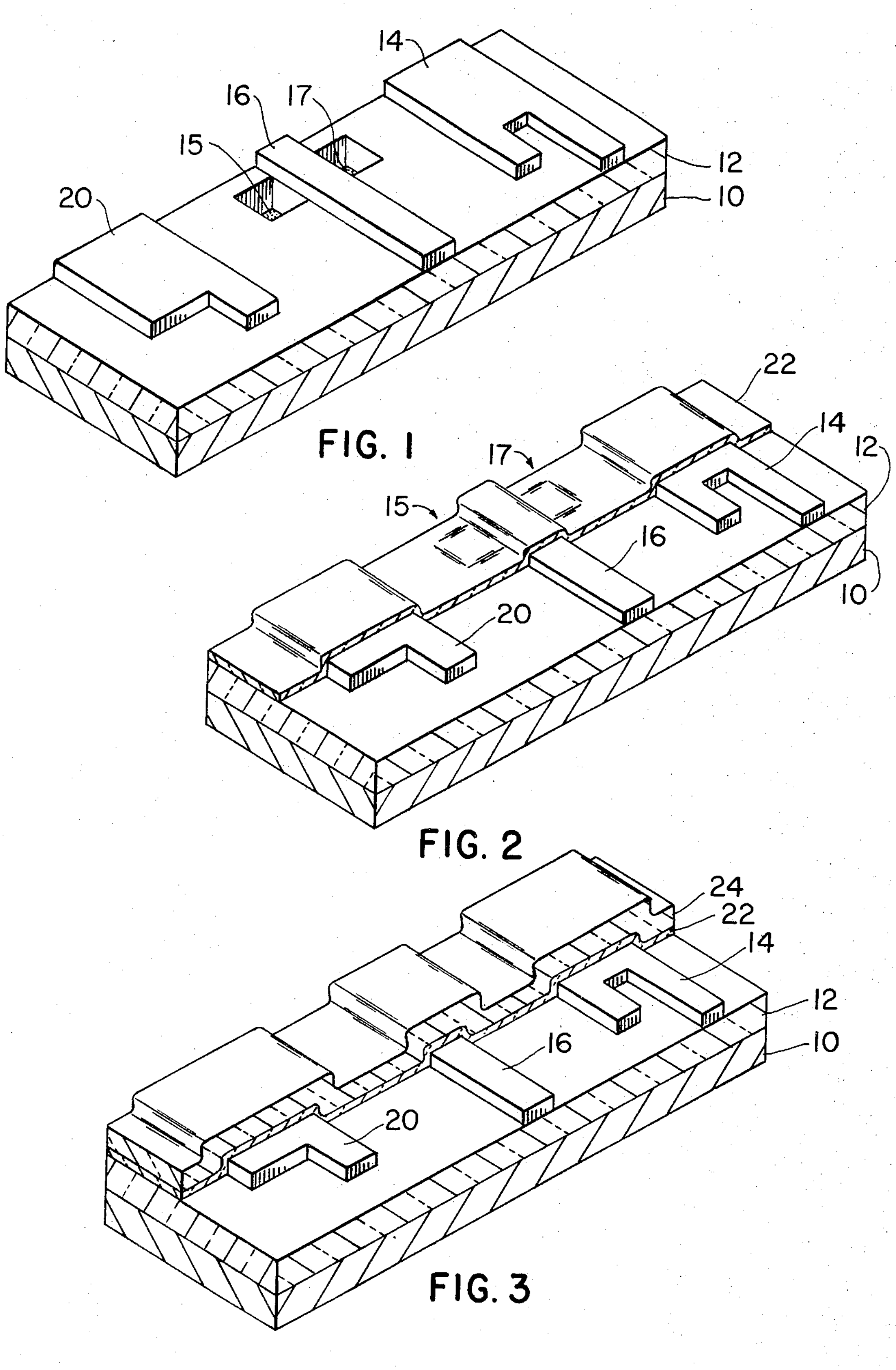
FIG. 1 is a perspective view of a semiconductor substrate which is insulated from a lower level of conductors.
FIG. 2 is a perspective view of a lower level of conductor with an undoped silicon oxide insulator layer on it.
FIG. 3 is a perspective view of the structure of FIG. 2 with a doped silicon oxide insulator layer on the undoped silicon oxide insulator layer.

As shown in FIG. 1 a semiconductor wafer 10 such as an n-type silicon wafer has a 10,000 Angstrom thick undoped insulator layer 12 such as a silicon oxide insulator layer grown thereon. Other material such as non-conductive aluminum oxide may be used to form insulator layer 12. A silicon oxide layer 12 may be formed by the oxidation of a silicon wafer 10 in steam in a furnace at about 1100° C. The regions of the silicon wafer 10 upon which aligned polysilicon gate electrodes are to be formed have the thick oxide layer 12 etched away and a 1,000 A. thick gate oxide is formed on the silicon wafer 10 by oxidizing the silicon wafer 10 in dry oxygen. A layer of polysilicon is deposited on the insulator layer 12 by the decomposition of silane in nitrogen atmosphere at 700° C. The layer of polysilicon is masked and etched in a mixture of hydrofluoric, nitric and acetic acids to form polysilicon leads 14, 16 and 20. The polysilicon leads 14, 16 and 20 may, by way of example, be gate electrode leads of three MOS transistors which are formed in the silicon wafer 10. The polysilicon leads 14, 16 and 20 have a thickness of between 3,000 Angstroms and 6,000 Angstroms. The molybdenum or tungsten may be used instead of polysilicon to form leads 14, 16 and 20. Portions of the insulator layer 12 to the sides of the lead 16 have been etched away and boron diffused in the silicon wafer 10 to form p-type source and drain regions 15 and 17 to the sides of lead 16. Again the oxide thickness under lead 16 between regions 15 and 17 would have been made about 1,000 Angstroms.

It is usually necessary to pass interconnections over the polysilicon leads, but to insulate the interconnections from the lower polysilicon leads. If the upper level interconnection conductors pass over sharp corners of an insulator layer which is deposited between lower leads and the upper level interconnection conductor, the upper level interconnections will be etched partially or totally at the sharp corners. To avoid this cracking problem, a doped oxide insulator layer can be formed on the lower leads and heated to make a smooth taper at the edges of lower level conductors prior to the depositing of an upper level of interconnection conductors over the lower level of polysilicon conductors. However source and drain regions 15 and 17 formed in the silicon wafer 20 will be improperly doped by this doped silicon dioxide insulator layer. Therefore a thin undoped silicon dioxide insulator layer is formed below the doped silicon dioxide insulator layer to prevent this improper doping.

As shown in FIG. 2 an undoped silicon oxide insulator layer 22 is formed on the lower polysilicon conductor leads 14, 16 and 20 prior to the formation of a doped silicon oxide insulator layer on the lower level of polysilicon conductors. Four percent silane gas in nitrogen gas and dry oxygen gas are reacted in a reactor in a stream of nitrogen at about 400° C. to form a 1,000 Angstrom thick undoped silicon oxide insulator layer 22 on the lower level of polysilicon conductors. The undoped silicon oxide layer 22 is also used to prevent improper doping of the lower level polysilicon leads 14, 16 and 20 by a doped oxide layer which is to be deposited between the lower level conductors and upper level conductors as well as to prevent improper doping of source and drain regions 15 and 17 which are formed within the silicon wafer 10.

An undoped silicon nitride insulator layer or an undoped aluminum oxide insulator layer may be used in place of undoped silicon oxide insulator layer 22. The undoped silicon nitride would be formed on the conductor leads 14, 16 and 20 by the reaction of silane gas and ammonia gas at 700° C. The aluminum oxide insulator layer would be formed by completely oxidizing an aluminum film placed over the conductor leads 14, 16 and 20.

As shown in FIG. 3 a 3,000 Angstrom thick doped silicon oxide layer 24 is formed on the undoped silicon oxide layer 22, by the reaction in a reactor of silane gas flowing at 22 cc per minute, oxygen gas flowing at 340 cc per minute and phosphine gas ($PH_3$) flowing at 6 cc per minute, the reactor being at a temperature of about 400° C. Nitrogen gas is used as a carrier gas and flows at 70 liters per minute. Phosphorous oxide ($P_2O_5$) and silicon dioxide ($SiO_2$) make up the doped silicon oxide layer 24. Other impurity materials such as boron from flowing diborane ($B_2H_6$) gas, or aluminum, lead, calcium or magnesium from suitable gases, will also lower the softening temperature of the silicon oxide insulator layer 24 and may be passed through the reactor with the silane and oxygen gases instead of phosphine gas. The doped silicon oxide insulator layer 24 which is on the undoped oxide layer 22, will soften and flow at a lower temperature of about 1,000° C., instead of about 1,300° C., so as to provide a tapered insulator layer 24 at a low enough temperature and so as not to destroy the p-n junctions in the silicon wafer 10. With a dopant concentration of phosphorous oxide in the doped silicon oxide layer 24 which is produced by the above ratio of phosphine, silane and oxygen gases the temperature for the resultant doped silicon oxide layer 24 to flow is about 1,000° C. Undoped silicon oxide requires a flow temperature greater than 1,300° C. The flow rate of the phosphine gas may be in the range of about 5 to 40 percent of the flow rate of the silane gas to form a suitable doped silicon oxide layer 24.

A doped silicon nitride insulator layer may be used in place of the doped silicon oxide insulator layer 24. The doped silicon nitride insulator layer may be formed on the undoped silicon oxide insulator layer by the reaction of silane gas and ammonia gas in flowing phosphine gas at 700° C. The flow temperature of the doped silicon nitride layer would be higher than the flow temperature of the doped silicon oxide layer 24.

Figures 4, 5:
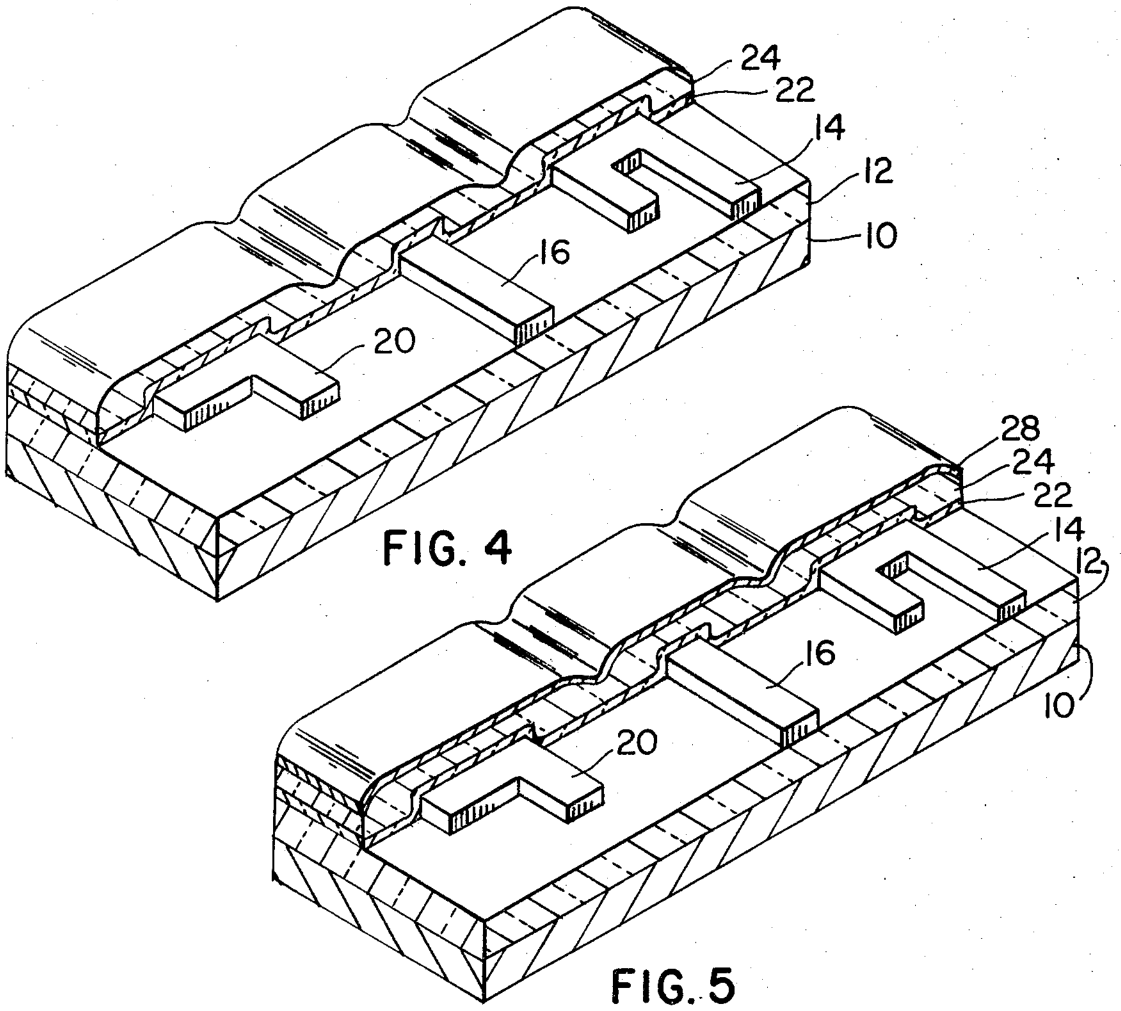
FIG. 4 is a perspective view of the structure of FIG. 3 after a heating step.
FIG. 5 is a perspective view of the structure of FIG. 4 with a layer of metalization on the doped silicon oxide insulator layer.

As shown in FIG. 4 the matrix of FIG. 3 has been heated for about 30 minutes at about 1,000° C. in a nitrogen atmosphere to cause the doped silicon oxide glass layer 24 to flow over steps in the undoped oxide layer 22 and over the lower level of polysilicon conductors 14, 16 and 20. The 1,000° temperature will not destroy the doped regions 15 and 17 in the silicon wafer 10. The heating should not however be greater than about 1,200° C., to prevent destruction of doped regions 15 and 17. A heating range between 800° C. and 1,200° C. for times between 5 and 60 minutes may be used. It is seen that the upper surface of the doped silicon oxide layer 24 has tapered steps, with no sharp corners of points where the doped silicon oxide layer 24 passes over the edges of the lower level of conductors. Since no sharp corners exist in the doped oxide layer 24, when an upper level of metalization is placed on doped oxide layer 24, and it is subsequently covered with photoresist which is then exposed to light and the metalization selectively etched, the upper level of conductors which are formed will not have discontinuities etched in them.

As shown in FIG. 5 a 14,000 Angstrom thick aluminum layer 28 is evaporated upon the tapered doped silicon oxide insulator layer 24. The aluminum layer 28 passes smoothly over steps in the doped insulator layer 24 and thus over the lower level of polysilicon conductors 14, 16 and 20. The aluminum layer 28 does not have sharp steps therein and thus after layer 28 is covered with a photoresist layer, the photoresist will be illuminated with ultra violet light at steps in the photoresist layer prior to etching. Discontinuities will therefor not be etched into the smooth aluminum layer 28 when the photoresist layer is developed, since the steps in the photoresist layer have been properly exposed.

Holes may be etched in the insulator layers 22 and 24 above either the conductors 14, 16 and 20 or above the source and drain regions 15 and 17. The aluminum layer 28 will then be formed into upper conductors which make contact to the lower conductors or source and drain regions 15 and 17 through these holes.

Figure 6:
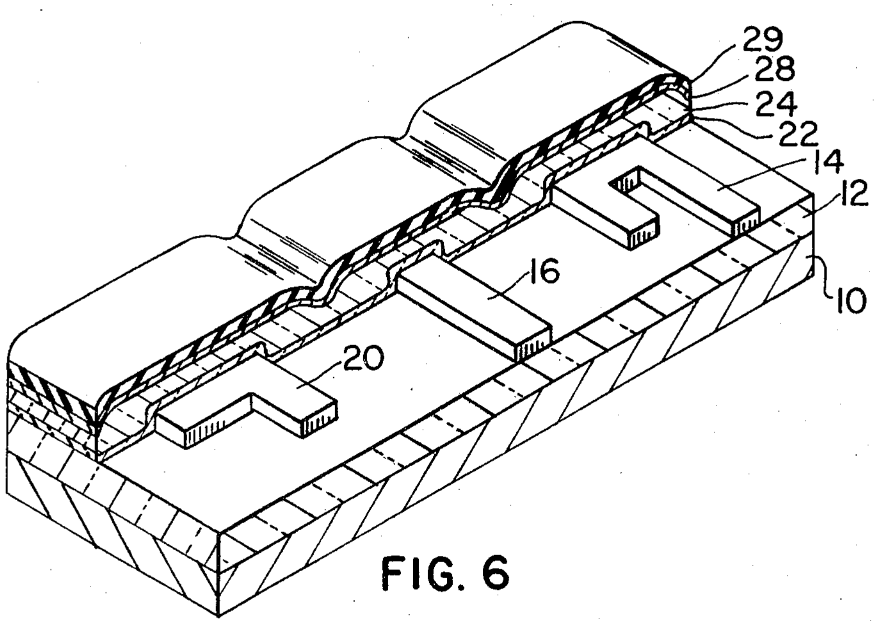
FIG. 6 is a perspective view of the structure of FIG. 5 with a layer of photoresist on the layer of metalization.

As shown in FIG. 6 a layer of photoresist 29 is formed on the aluminum layer 28. The photoresist layer 29 passes smoothly over the tapered corners of the aluminum layer 28. The photoresist layer will thus be completely illuminated with ultra violet light which is used to set selected strips of the photoresist layer 29.

Figures 7, 8:
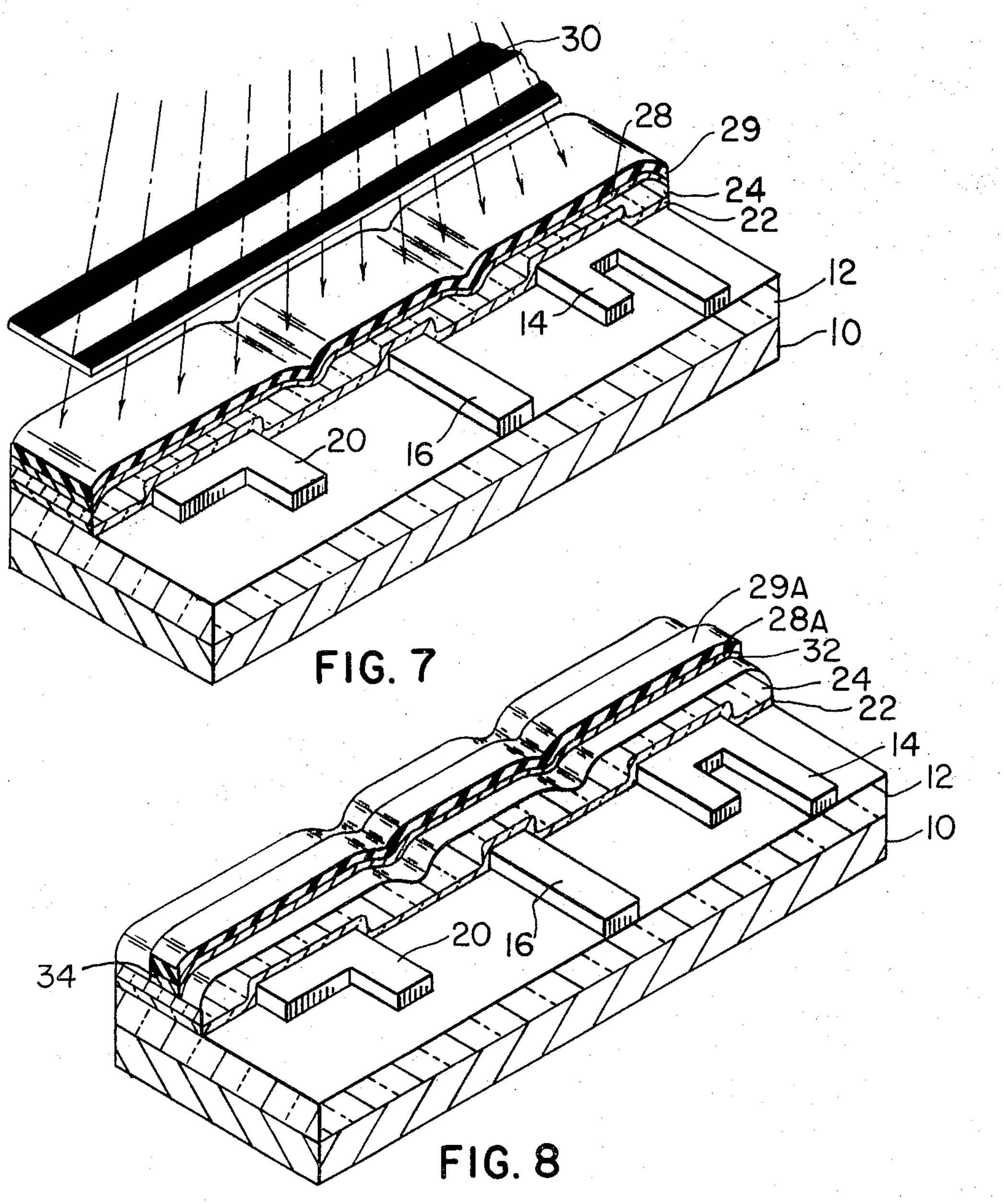
FIG. 7 is a perspective view of the structure of FIG. 6 with the layer of photoresist being selectively illuminated.
FIG. 8 is a perspective view of the structure of FIG. 7 after the photoresist layer has been developed and the upper layer of metalization has been etched into an upper conductor.

FIG. 7 shows the illumination of a strip of the photoresist layer 29 in order to harden the center section of the photoresist layer 29. An illumination mask 30 is used between an ultra violet light source and the photoresist layer 29 for the purpose of this selective illumination. Since the doped silicon oxide layer 24 is tapered, the complete center section of the photoresist layer 29 is illuminated, even at steps in the photoresist layer 29 which are tapered due to the tapered silicon oxide insulator layer 24.

FIG. 8 shows that a continuous strip 29A of the photoresist layer 29 is hardened by the illumination, due to the presence of tapered steps in the doped silicon oxide insulator layer 24. FIG. 8 further shows that a continuous interconnection conductor 28A is formed on the tapered doped silicon oxide insulator layer 24 after etching the aluminum layer 28 with phosphoric acid. The continuous interconnection conductor 28A of aluminum will realiably conduct electricity from its one end 32 to its other end 34. High reliability of the interconnection conductor 28A above and over the polysilicon conductors 14, 16 and 20 is achieved by use of the doped silicon oxide insulator layer 24.

What is claimed is:

1. A semiconductor structure, comprising:

a. a semiconductor substrate;

b. a plurality of first conductor leads in contact with and covering certain areas of one surface of the semiconductor substrate;

c. an undoped insulator layer covering both the plurality of first conductor leads and any remaining uncovered areas of the surface of the semiconductor substrate;

d. a doped insulator layer disposed on the undoped insulator layer, and having tapered sections at those portions of the doped insulator layer adjacent the edges of the plurality of first conductor leads; and e. a plurality of second conductor leads disposed on the exposed tapered sections of the doped insulator layer.

2. The semiconductor structure of claim 1 wherein the at least one second electrical lead is aluminum.

3. The structure of claim 1 wherein the plurality of first conductor leads are polysilicon.

4. The structure of claim 1 wherein the doped insulator layer is doped with phosphorous oxide.

5. The structure of claim 1 wherein the undoped insulator layer is an undoped silicon oxide insulator layer.

6. The structure of claim 1 wherein the doped insulator is a doped silicon oxide insulator layer.

7. A semiconductor structure, comprising:

a. a semiconductor substrate;

b. a first undoped insulator layer disposed on selected portions of the semiconductor substrate;

c. a plurality of first conductor leads on selected areas of the exposed surface of the first undoped insulator layer;

d. a second undoped insulator layer on the plurality of first conductor leads and also on exposed areas of the surface of the semiconductor substrate;

e. a doped insulator layer on the exposed surface of the second undoped unsulator layer; and f. a plurality of second conductor leads on the exposed surface of the doped silicon oxide insulator layer.

* * * * *